(12) United States Patent
Yoda et al.

(10) Patent No.: US 7,851,534 B2
(45) Date of Patent: Dec. 14, 2010

(54) THERMALLY CONDUCTIVE SHEET

(75) Inventors: Masaki Yoda, Sagamihara (JP); Yoshinao Yamazaki, Sagamihara (JP)

(73) Assignee: 3M Innovative Properties Company, St. Paul, MN (US)

( * ) Notice: Subject to any disclaimer, the term of this patent is extended or adjusted under 35 U.S.C. 154(b) by 885 days.

(21) Appl. No.: 11/568,231

(22) PCT Filed: May 20, 2005

(86) PCT No.: PCT/US2005/017668

§ 371 (c)(1),
(2), (4) Date: Oct. 24, 2006

(87) PCT Pub. No.: WO2006/016936

PCT Pub. Date: Feb. 16, 2006

(65) Prior Publication Data

US 2007/0224426 A1    Sep. 27, 2007

(30) Foreign Application Priority Data

Jul. 9, 2004    (JP) .............................. 2004-203322

(51) Int. Cl.
*C08K 3/18*   (2006.01)
*C08F 2/44*   (2006.01)

(52) U.S. Cl. ..................... 524/430; 428/409

(58) Field of Classification Search .............. 524/430; 428/409

See application file for complete search history.

(56) References Cited

U.S. PATENT DOCUMENTS 4,483,958 A * 11/1984 Kosaka et al. ............... 524/409
5,300,569 A    4/1994 Drake et al.
5,530,064 A * 6/1996 Ashton et al. ............... 525/102
5,989,459 A    11/1999 Nguyen et al.

FOREIGN PATENT DOCUMENTS

| JP | 57-3841      |   | 1/1982  |
|----|--------------|---|---------|
| JP | 57003841 A   | * | 1/1982  |
| JP | 57-42750     |   | 3/1982  |
| JP | 57042750 A   | * | 3/1982  |
| JP | 05-171057    |   | 7/1993  |
| JP | 05-320414    |   | 12/1993 |
| JP | 10-316953    |   | 12/1998 |
| JP | 10-330575    |   | 12/1998 |
| JP | 11-209618    |   | 8/1999  |
| JP | 11-292998    |   | 10/1999 |
| JP | 2001-302234  |   | 10/2001 |
| JP | 2002-284884  |   | 10/2002 |
| JP | 2003-213133  |   | 7/2003  |
| JP | 2004-002527  |   | 1/2004  |
| JP | 2004-010859  |   | 1/2004  |
| JP | 2004-059851  |   | 2/2004  |

OTHER PUBLICATIONS

"Kneading Technique for Resin/Filler System", by Technical Information Institute Co., Ltd., Mar. 31, 2001.

* cited by examiner

*Primary Examiner*—Michael M Bernshteyn
(74) *Attorney, Agent, or Firm*—Scott A. Bardell; Dean M. Harts; Ann Kulprathipanja

(57) ABSTRACT

There is provided a thermally conductive sheet containing: a binder component, a modified liquid polyolefin, and at least one thermally conductive filler selected from the group consisting of metal oxide and metal hydroxide. The thermally conductive sheet can have good moldability, and the surface of the sheet is inhibited from being contaminated by bleeding or the like. Further, the sheet can have good flexibility maintained for a long period of time and is inhibited from deteriorating or emitting an offensive odor due to decomposed matter of an organic phosphorous compound even when an organic phosphorous compound is contained.

6 Claims, No Drawings

THERMALLY CONDUCTIVE SHEET

FIELD

The present invention relates to a thermally conductive sheet. More specifically, the present invention relates to a thermally conductive sheet having good moldability and flexibility, whose surface is inhibited from being contaminated and which is inhibited from deteriorating and emitting an offensive odor.

BACKGROUND

A thermally conductive sheet is generally disposed between a radiating body such as a heat sink and a heat-generating part for electronics or electronic parts including an integrated circuit (IC). Such a heat conductive sheet has conventionally contained a thermally conductive filler such as alumina or aluminum hydroxide.

In order to allow the thermally conductive sheet to exhibit superior thermal conductivity, higher amount of a thermally conductive filler is desired to be filled uniformly in the thermally conductive sheet. The thermally conductive filler is subjected to a surface treatment generally with a surface-treating agent such as silane coupling agent, titanate type coupling agent, or aluminate type coupling agent to fill the filler in the thermally conductive sheet uniformly with high concentration (see JP-A-11-209618 and JP-A-2003-213133).

However, kneading and heat treatment for a long period of time is generally necessary to sufficiently subject the thermally conductive filler to a surface treatment with a surface-treating agent including these coupling agents. Thus, a surface treatment of a thermally conductive filler with a surface-treating agent is complex and sometimes needs long time. This causes an increase in production cost for a thermally conductive composition and a thermally conductive sheet using a thermally conductive composition (see JP-A-11-209618, JP-A-2003-213133, JP-A-5-171057, and JP-A-2001-302234).

A thermally conductive composition obtained with insufficient kneading of a surface-treating agent and a thermally conductive filler or with insufficient heat treatment cannot easily be molded into a predetermined shape or applied on a support such as a liner. In addition, a thermally conductive sheet obtained by using such a thermally conductive composition sometimes has a problem of heat aging or bleeding of a surface-treating agent (coupling agent).

Meanwhile, as inexpensive surface-treating agents usable in place of the above coupling agent, there have been known higher fatty acids, higher fatty acid esters, and low molecular weight surfactants, and the like (see "Kneading Technique for Resin/Filler System", by Technical Information Institute Co., Ltd., Mar. 31, 2001; and JP-A-2004-2527). However, thermally conductive compositions using these surface-treating agents do not have sufficiently improved moldability and has a problem of difficulty in increasing an amount of a thermally conductive filler in the thermally conductive sheet to be obtained.

There has also been proposed a method using a polymer containing a polar group or a high molecular weight dispersant as a surface-treating agent (see "Kneading Technique for Resin/Filler System", by Technical Information Institute Co., Ltd., Mar. 31, 2001; JP-A-5-320414; JP-A-2002-284884; JP-A-2004-59851; and JP-A-2004-10859). However, when the polar group of the polymer containing a polar group is cationic, the polymer is required for neutralization with strong acid when it is used as disclosed in JP-A-5-320414. Therefore, there arises a problem that sufficient care should be taken against corrosion of a device or the like. When a solid or rubber-like polymer is used as the polymer as disclosed in "Kneading Technique for Resin/Filler System" or JP-A-2002-284884, conditions for use are remarkably restricted disadvantageously in comparison with the case of using a liquid surface-treating agent.

Further, JP-A-2004-59851 and JP-A-2004-10859 disclose thermally conductive sheets each using copolymer having a predetermined acid number or a high molecular weight dispersant. However, an olefin-maleic anhydride copolymer is solid at around ordinary temperature and has a problem of low compatibility with various resins and monomers.

Meanwhile, with regard to a thermally conductive sheet using a non-silicone resin as a binder component, an organic phosphorous compound such as phosphates is generally blended, as a flame retardant, in a thermally conductive composition constituting the thermally conductive sheet to impart flame retardancy to the sheet. However, such an organic phosphorous compound is easily hydrolyzed, which sometimes causes deterioration of the thermally conductive sheet, and sometimes an offensive odor is easily emitted.

SUMMARY

The present invention has been made in consideration of the conventional problems, aiming to provide a thermally conductive sheet, which can have good moldability, whose surface is inhibited from being contaminated by bleeding or the like, which can have good flexibility maintained for a long period of time, and which is inhibited from deteriorating or emitting an offensive odor due to decomposed matter of an organic phosphorous compound even when an organic phosphorous compound is contained.

The present inventors made an energetic study to address the above object and, as a result, found out that the above problems can be solved by adding a modified liquid polyolefin to a predetermined binder component and a thermally conductive filler, which led to the achievement of the present invention.

That is, according to the present invention, there is provided a thermally conductive sheet as described below:

A thermally conductive sheet comprising:
  a binder component,
  a modified liquid polyolefin, and
  at least one thermally conductive filler selected from the group consisting of metal oxide and metal hydroxide.

In the thermally conductive sheet of the present invention, it is preferable that the metal oxide is alumina and the metal hydroxide is aluminum hydroxide or magnesium hydroxide.

In the thermally conductive sheet of the present invention, it is preferable that the modified liquid polyolefin is prepared by modifying a predetermined polyolefin having a kinematic viscosity of 100 to 2500 $mm^2/s$ at 40° C.

In the thermally conductive sheet of the present invention, it is preferable that the modified liquid polyolefin has an acid number of 5 to 130 mgKOH/g.

It is preferable that the thermally conductive sheet of the present invention further comprises an organic phosphorus compound as a flame retardant.

In the thermally conductive sheet of the present invention, it is preferable that the binder component is prepared by polymerizing (meth)acrylic monomers.

A thermally conductive sheet of the present invention contains a binder component, a modified liquid polyolefin, and at least one thermally conductive filler selected from the group consisting of metal oxide and metal hydroxide. Therefore, a thermally conductive sheet of the present invention has good moldability and exhibit effects in inhibiting contamination on the surface thereof due to bleeding or the like and in maintaining good flexibility for a long period of time. Moreover, even when an organic phosphorous compound is contained in the sheet, the sheet exhibit an effect in inhibiting deterioration of the sheet or emission of an offensive odor due to decomposed matter of the organic phosphorous compound.

DETAILED DESCRIPTION

The present invention is hereinbelow described with regard to preferred embodiments of the present invention. However, the present invention should not be limited to the following embodiments and may suitably be modified or improved on the basis of those skilled in the art within the range not deviating from the gist of the present invention. Incidentally, in this specification, "(meth)acrylic" means "acrylic or methacrylic," and "(meth)acrylic monomer" means an acrylic monomer such as acrylic acid or acrylic ester, or a methacrylic monomer such as methacrylic acid or methacrylic ester. In addition, "(meth)acrylic polymer" means "polymer obtained by polymerizing monomers including acrylic monomers or methacrylic monomers."

(1) Binder Component

A thermally conductive sheet, which is an embodiment of the present invention, contains a binder component, a modified liquid polyolefin, and at least one thermally conductive filler selected from the group consisting of metal oxide and metal hydroxide. The binder component contained in the thermally conductive sheet of the present embodiment may be a general polymer and is not particularly limited. However, the binder is preferably prepared by polymerizing (meth) acrylic monomers. Incidentally, "(meth)acrylic monomer" includes both monofunctional (meth)acrylic monomer and polyfunctional (meth)acrylic monomer.

One or mixtures of monofunctional (meth)acrylic monomer(s) may be used. Preferable examples are monofunctional (meth)acrylic monomers having alkyl groups with 20 or less carbons, including ethyl (meth)acrylate, butyl (meth)acrylate, hexyl (meth)acrylate, 2-ethylhexyl (meth)acrylate, octyl (meth)acrylate, isooctyl (meth)acrylate, decyl (meth)acrylate, dodecyl (meth)acrylate, acrylic acid, methacrylic acid.

Polyfunctional (meth)acrylic monomer is a compound having two or more functional groups selected from the group consisting of an acryloxy group and a methacryloxy group. Incidentally, one or mixtures of polyfunctional (meth)acrylic monomer(s) may be used. Preferable examples includes: di(meth)acrylates such as 1,6-hexanediol diacrylate, 1,4-butanediol diacrylate, ethylene glycol diacrylate, diethylene glycol diacrylate, tetraethylene glycol diacrylate, tripropylene glycol diacrylate, neopentyle glycol diacrylate, 1,4-butanediol dimethacrylate, poly(butanediol) diacrylate, tetraethylene glycol dimethacrylate, 1,3-butylene glycol diacrylate, triethylene glycol diacrylate, triisopropylene glycol diacrylate, polyethylene glycol diacrylate, and bisphenol A dimethacrylate; tri(meth)acrylates such as trimethylol propane triacrylate, trimethylol propane trimethacrylate, pentaerythritol monohydroxy triacrylate, and trimethylol propane triethoxy triacrylate; tetraacrylates such as pentaerythritol tetraacrylate, and di(trimethylol propane) tetraacrylate; and pentaacrylate such as dipentaerythritol (monohydroxy) pentaacrylate.

(2) Modified Liquid Polyolefin

A modified liquid polyolefin contained in a thermally conductive sheet of an embodiment of the present invention is a component which functions as a surface-treating agent of a thermally conductive filler and is a liquid polyolefin at ordinary temperature (25° C.). More specifically, a modified liquid polyolefin in the present embodiment has a substituent introduced by subjecting a predetermined polyolefin, which is a homopolymer or copolymer of olefin, to a graft modification and/or Ene reaction with maleic anhydride or a maleic anhydride derivative. Examples of monomer constituting a homopolymer or copolymer of olefin include: α-olefines such as ethylene, propylene, butene-1, hexene-1, octene-1, decene-1,4-methylpentene-1, and 2-methylpropene. These α-olefines may be used alone or in combination. Examples of a homopolyer or copolymer of olefine include: ethylene propylene copolymer, ethylene butene-1 copolymer, 2-methylpropene homopolymer, and decene homopolymer. Examples of "a maleic anhydride derivative" include maleates such as ethyl maleate, propyl maleate, and butyl maleate. A graft-modified liquid polyolefin can be prepared by a conventionally-known method, for example, by melting and stirring a predetermined liquid polyolefin and maleic anhydride or a maleic anhydride derivative at appropriate temperature in the presence of a polymerization initiator such as an organic peroxide. Alternatively, a graft-modified liquid polyolefin may be prepared by dissolving a predetermined liquid polyolefin and maleic anhydride or a maleic anhydride derivative in an organic solvent to obtain a solution, and then, stirring the solution at an appropriate temperature in the presence of a polymerization initiator such as an organic peroxide.

When a predetermined liquid polyolefin has an unsaturated bond at the chain end, or the like, a predetermined substituent can be introduced into a predetermined polyolefin by the Ene reaction using maleic anhydride or a maleic anhydride derivative. For example, a modified liquid polyolefin may be prepared by melting and stirring a predetermined liquid polyolefin and maleic anhydride or a maleic anhydride derivative at 100 to 200° C.

A modified liquid polyolefin contained in the thermally conductive sheet of the present embodiment is liquid at ordinary temperature (25° C.). Therefore, as compared with a surface-treating agent which is solid at ordinary temperature, the modified liquid polyolefin can be used widely because it has less limitation with regard to instruments and conditions for use. When the modified liquid polyolefin is used as a surface-treating agent for a thermally conductive filler, a thermally conductive filler may be added to a previously prepared mixture of the modified liquid polyolefin and a monomer constituting a binder component, for example, a (meth) acrylic monomer.

Alternatively, a monomer constituting a binder component, a thermally conductive filler, and a modified liquid polyolefin may be mixed together at once to subject the thermally conductive filler to a surface treatment.

A predetermined polyolefin used for preparing a modified liquid polyolefin preferably has a kinematic viscosity of 100 to 2500 mm$^2$/s at 40° C., more preferably 120 to 2300 mm$^2$/s, particularly preferably 140 to 2000 mm$^2$/s. When a kinematic viscosity of a modified liquid polyolefin is less than 100 mm$^2$/s at 40° C., a resultant thermally conductive sheet is prone to have bleeding. On the other hand, when a kinematic viscosity of a modified liquid polyolefin is more than 2500 mm$^2$/s at 40° C., a resultant modified liquid polyolefin tends to be deteriorated as a surface-treating agent.

In addition, in the thermally conductive sheet of the present embodiment, a modified liquid polyolefin preferably has an acid number of 5 to 130 mgKOH/g, more preferably 10 to 100 mgKOH/g, particularly preferably 20 to 80 mgKOH/g. When the acid number of the modified liquid polyolefin is less than 5 mgKOH/g, the resultant sheet is prone to have bleeding, and the modified liquid polyolefin tends to be deteriorated as a surface-treating agent. On the other hand, when the acid number is more than 130 mgKOH/g, a thermally conductive composition before being molded into a sheet tends to have excessively high viscosity, and handleability of the thermally conductive composition tends to deteriorate. Incidentally, "an acid number" in this specification means a value obtained by measurement according to JIS K2501.

In the present embodiment, it is also preferable that an appropriate amount of a predetermined polyolefin which is not graft-modified with maleic anhydride or the like is added to the above thermally conductive composition to adjust the acid number of the whole polyolefin components in the aforementioned range of the acid numbers. Incidentally, "the whole polyolefin components" means the total polyolefin components of a modified liquid polyolefin and a predetermined polyolefin to be added.

An amount of modified liquid polyolefin contained in the thermally conductive sheet of the present embodiment is preferably 20% by weight or less with respect to the amount of thermally conductive filler described below, more preferably 10% by weight or less. When the amount of the modified liquid polyolefin contained is more than 20% by weight with respect to the amount of the thermally conductive filler, the resultant thermally conductive sheet tends to have insufficient strength. Incidentally, there is no lower limitation on an amount of the modified liquid polyolefin as long as it is 0.1% by weight or more with respect to the amount of thermally conductive filler in consideration of substantial effects, or the like.

(3) Thermally Conductive Filler

A thermally conductive filler contained in the thermally conductive sheet of the present embodiment is a component necessary for a thermally conductive sheet to exhibit substantial thermal conductivity and flame retardancy. A thermally conductive filler employed is specifically at least one selected from the group consisting of metal oxide and metal hydroxide from the viewpoint of physical affinity with a modified liquid polyolefin contained as a surface-treating agent together with the filler. As the metal oxide, alumina is preferable. As the metal hydroxide, aluminum hydroxide or magnesium hydroxide is preferable.

In the thermally conductive sheet of the present embodiment, a thermally conductive filler such as a ceramic, a metal oxide, or a metal hydrate may further be contained besides the aforementioned thermally conductive filler. It is preferable that such a thermally conductive filler is further contained because the thermally conductive sheet can have further enhanced thermal conductivity. Examples of the ceramic include: boron nitride, aluminum nitride, silicon nitride, boron carbide, aluminum carbide, and silicon carbide. Examples of the metallic oxide include magnesium oxide, beryllium oxide, titanium oxide, zirconium oxide, and zinc oxide. Examples of the metal hydrate include: barium hydroxide, calcium hydroxide, dawsonite, hydrotalcite, zinc borate, calcium aluminate, and zirconium oxide hydrate.

Generally, these thermally conductive fillers are added to the material in the form of particles. It is preferred that a group of relatively large particles having the average particle diameter of 5 to 50 μm and a group of relatively small particles having the average particle diameter of below 5 μm is used in combination so as to increase the amount of the thermally conductive filler to be added to the material. It is further preferable to use a thermally conductive filler which has been subjected to a surface treatment with silane, titanate, fatty acid, or the like, so as to enhance strength of the resultant thermally conductive sheet.

The content of the thermally conductive filler blended in the thermally conductive sheet of the present embodiment is preferably 200 parts by weight or more, more preferably 300 parts by weight or more, particularly preferably 400 parts by weight or more, with respect to 100 parts by weight of monomer constituting the binder component. When the content is less than 200 parts by weight, sometimes thermal conductivity of the resultant thermally conductive sheet is hardly enhanced. Incidentally, though there is no particular upper limit regarding the content of the thermally conductive filler, the content may be 1500 parts by weight or less from the viewpoint of practical manufacturability.

(4) Other Additives

Various kinds of additives may be added to the materials for the thermally conductive sheet of the present embodiment as long as the characteristics of the thermally conductive sheet are not spoiled. Examples of the additive include: crosslinking agents, tackifiers, antioxidants, chain-transfer agents, plasticizers, flame retardants, flame retarding auxiliaries, precipitation inhibitors, thickeners, thixotropic agents such as ultra-fine silica powder, surfactants, antifoamers, colorants, electrically conductive particles, antistatic agents, and surface-treating agents. Incidentally, one or mixtures of these additive(s) may be used.

When a flame retardant is added to the composition, it is preferred to use a flame retardant which is substantially free from halogen (hereinbelow referred to as "halogen-free flame retardant"). Examples of the halogen-free flame retardant include: organic phosphorus compounds, expansible graphite, poly(phenylene ether), and triazine skeleton-containing compounds. Among these, organic phosphorous compounds are most preferable from the viewpoint of exhibition of flame retardant effect. Incidentally, one or mixtures of these flame retardant(s) may be used.

The organic phosphorous compound may be a copolymerizable or uncopolymerizable with the monomer constituting the binder component. Examples of the organic phosphorous compound copolymerizable with these monomers include phosphate-containing (meth)acrylic monomers shown by the following general Formula 1.

Formula 1

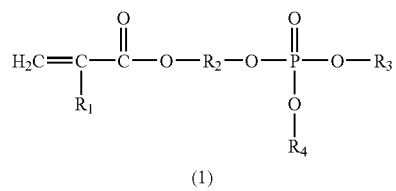

(1)

(wherein, R1 represents hydrogen or a methyl group, R2 represents an alkylene group, and R3 and R4 represent an alkyl group or an aryl group, independently.)

Examples of the phosphate-containing (meth)acrylic monomer include:
dimethyl((meth)acryloyloxymethyl)phosphate,
diethyl((meth)acryloyloxymethyl)phosphate,
diphenyl((meth)acryloyloxymethyl)phosphate,
dimethyl(2-(meth)acryloyloxyethyl)phosphate, diethyl(2-(meth)acryloyloxyethyl)phosphate,
diphenyl(2-(meth)acryloyloxyethyl)phosphate,
dimethyl(3-(meth)acryloyloxypropyl)phosphate,
diethyl(3-(meth)acryloyloxypropyl)phosphate, and
diphenyl(3-(meth)acryloyloxypropyl)phosphate.

These phosphate-containing (meth)acrylic monomers may be used singly or in combination of two or more kinds.

The content of the phosphate-containing (meth)acrylic monomer in the thermally conductive sheet of the present embodiment is preferably 1 to 30 parts by weight, more preferably 5 to 20 parts by weight, with respect to 100 parts by weight of monomer constituting the binder component. When the content is less than 1 parts by weight, flame retardant effect is sometimes deteriorated. When the content is more than 30 parts by weight, the resultant thermally conductive sheet sometimes has lowered flexibility.

Examples of organic phosphorous compound uncopolymerizable with monomers constituting the binder component include: phosphate esters, aromatic condensed phosphates, and ammonium polyphosphates. Since the thermally conductive sheet of the present embodiment contains a modified liquid polyolefin as a surface-treating agent for a thermally conductive filler, phosphate ester is hardly hydrolyzed even when a compound having a phosphate ester bond is contained in the sheet. Therefore, the thermally conductive sheet of the present embodiment hardly causes deterioration and emission of an offensive odor even when the sheet contains a phosphate ester bond or a compound having a phosphate ester bond, and the sheet has superior flame retardancy.

Examples of the phosphate esters include: triphenyl phosphate, tricresyl phosphate, cresyl diphenyl phosphate, 2-ethylhexyl diphenyl phosphate, tri-n-butyl phosphate, trixylenyl phosphate, resorcinol bis(diphenyl phosphate), and bisphenol A bis(diphenyl phosphate).

The content of the organic phosphate compound substantially uncopolymerizable with monomer constituting the binder component in the thermally conductive sheet of the present embodiment is preferably 5 to 50 parts by weight, more preferably 10 to 30 parts by weight, with respect to 100 parts by weight of monomer constituting the binder component. When the content is less than 5 parts by weight, flame retardant effect is sometimes deteriorated. When the content is more than 50 parts by weight, the resultant thermally conductive sheet has lowered cohesion or sometimes shows a bleeding phenomenon.

The thermally conductive sheet of the present embodiment has good moldability, and contamination on the surface of the sheet due to bleeding or the like can be suppressed. Further, the thermally conductive sheet has good flexibility, which is maintained for a long period of time, and heat aging is hardly caused. Moreover, a phosphate ester is hardly hydrolyzed even when a phosphate ester is contained in the sheet, and therefore, in the thermally conductive sheet, deterioration of the sheet itself and emission of an offensive odor due to the hydrolysis or the like can be suppressed very effectively. Therefore, the thermally conductive sheet of the present embodiment has good preservability, and consideration to an influence on the environment, the human body, and the like is given.

Next, description is given with regard to an embodiment of a method for manufacturing a thermally conductive sheet of the present invention. A thermally conductive sheet of the present embodiment may be manufactured according to a method described in conventionally-known documents such as JP-A-11-292998, JP-A-10-316953, and JP-A-10-330575.

When a monofunctional (meth)acrylic monomer is used as a monomer constituting the binder component, the monofunctional (meth)acrylic monomer generally has low viscosity and in some cases has insufficient handleability. In such a case, a component of the thermally conductive filler, or the like, sometimes precipitates. Therefore, it is preferred to increase viscosity previously by partial polymerization of (meth)acrylic monomers. It is preferred to perform partial polymerization until the viscosity becomes about 5 to 10000 mPa·s. Partial polymerization can be performed in various manners, for example, thermal polymerization, ultraviolet polymerization, electron beam polymerization, gamma-ray polymerization, and ion-beam polymerization.

Incidentally, polymerization initiators such as photopolymerization initiators and thermal polymerization initiators may be added to (meth)acrylic monomers to perform the above partial polymerization. Examples of thermal polymerization initiators include organic peroxides such as diacyl peroxides, peroxy ketals, ketone peroxides, hydro peroxides, dialkyl peroxides, peroxy esters, and peroxydicarbonates. More specific examples of the organic peroxides include: lauroyl peroxide, benzoyl peroxide, cyclohexanone peroxide, 1,1-bis(t-butylperoxy)3,3,5-trimethylcyclohexane, and tert-butyl hydro peroxide. Incidentally, a combination of persulfate and bisulfite can also be used.

Examples of photopolymerization initiators include: benzoin ethers such as benzoin ethyl ether and benzoin isopropyl ether; anisoin ethyl ether, anisoin isopropyl ether, Michler's ketone (4,4'-tetramethyldiaminobenzophenone); and substituted acetophenones such as 2,2-dimethoxy-2-phenylacetophenone (for example, commercial name: KB-1 produced by Sartomer Co., Inc. and commercial name: Irgacure 651 produced by Ciba Specialty Chemicals K.K.), 2,2-diethoxy-acetophenone. Other examples include: substituted α-ketols such as 2-methyl-2-hydroxypropiophenone, aromatic sulphonylchlorides such as 2-naphthalenesulphonylchloride, and photoactive oxime compounds such as 1-phenone-1,1-propanedion-2-(o-ethoxycarbonyl) oxime. In addition, the above thermal polymerization initiators and photo polymerization initiators may be used in any combination.

No limitation is given to the content of the polymerization initiator used upon partial polymerization of (meth)acrylic monomers. However, the content is generally 0.001 to 5 parts by weight with respect to 100 parts by weight of (meth)acrylic monomers. Further, it is preferred to add a chain-transfer agent selected from mercaptanes, disulfides, a-methylstyrene dimer, and a combination thereof upon partial polymerization so as to control molecular weight and content of polymers contained in partially polymerized polymers obtained by the partial polymerization. Generally, the content of the chain-transfer agent is preferably 0.01 to 1 parts by weight, more preferably 0.02 to 0.5 parts by weight, with respect to 100 parts by weight of (meth)acrylic monomer.

In the case that a (meth)acrylic monomer is used as a monomer constituting the binder component, when the thermally conductive composition containing (meth)acrylic monomer, a modified liquid polyolefin, and a thermally conductive filler at the previous stage of molding into a sheet is cured (polymerized), a partially polymerized polymer obtained by partially polymerizing the above monofunctional (meth)acrylic monomer and/or polymerization initiator are added to the thermally conductive composition as necessary. Polymerization can be performed in various manners, for example, thermal polymerization, ultraviolet polymerization, electron beam polymerization, gamma-ray polymerization, and ion-beam polymerization.

When the above thermally conductive compositions are thermally polymerized, a suitable amount of the above thermal polymerization initiator may be contained in the compositions. When the thermally conductive compositions are subjected to ultraviolet polymerization, a suitable amount of the above photopolymerization initiator may be contained in the thermally conductive compositions. However, when polymerization is conducted by the use of particle beam like electron beam polymerization, no polymerization initiator is required generally. Incidentally, thermal polymerization is performed by deaerating and mixing the thermally conductive compositions with a planetary mixer, or the like, to obtain a mixture, molding the mixture in the shape of a sheet, and then heating the mixture to about 50 to 200° C.

When the above thermally conductive compositions are subjected to ultraviolet polymerization, the thermally conductive compositions may be subjected to deaerating and mixing with a planetary mixer, or the like, to obtain a mixture, molding the mixture in the shape of a sheet, and irradiating ultraviolet radiation. However, when a large amount of thermally conductive filler is used, transmission of ultraviolet radiation is sometimes limited. In such a case, thermal polymerization is preferably employed in place of ultraviolet polymerization. Incidentally, it is preferred to conduct polymerization under an inert gas atmosphere such as nitrogen gas atmosphere to suppress inhibition of polymerization by oxygen.

The thermally conductive sheet of an embodiment of the present invention is disposed between a heat sink, a heat radiator, or the like, and electronic parts, particularly, semiconductor electronic parts such as a power transistor, a graphic integrated circuit (IC), a chip set, a memory set, and central processing unit (CPU), and used to suitably transmit heat between them. The thickness of the thermally conductive sheet of the present embodiment is not particularly limited. However, the thickness may be 0.1 mm or more from the viewpoint of practical manufacturability and handleability.

EXAMPLE

The present invention is hereinbelow described specifically on the basis of Examples. However, the present invention is by no means limited to the Examples.

Preparation of the Thermally Conductive Compositions

The components shown in Table 1 were put in a planetary mixer altogether and kneaded for 30 minutes under reduced pressure (50 mmHg) to obtain compositions of Nos. 1 to 4. Incidentally, the liquid polyolefin (ethylene-propylene copolymer, commercial name: HC-40 produced by Mitsui Chemicals, Inc.) had an acid number of 0 mgKOH/g and a kinematic viscosity of 380 mm$^2$/s at 40° C. The modified liquid polyolefin used (maleinated ethylene-propylene copolymer) was prepared as follows: Ethylene-propylene copolymer (commercial name: HC-20 produced by Mitsui Chemicals, Inc.; kinematic viscosity at 40° C.: 380 mm$^2$/s) was put in a 300 ml glass reactor having a mixing blade and heated up to 160° C. under nitrogen atmosphere. With the temperature being maintained, 10 g of molten maleic anhydride and 2 g of di-tert-butyl peroxide was dropped for 5 hours. After the dropping, the copolymer was stirred for one hour at the same temperature. Further, with the temperature being maintained, the copolymer was deaerated for 1 hour to remove a volatile part, followed by cooling to obtain maleinated ethylene-propylene copolymer. The maleinated ethylene-propylene copolymer had an acid number of 110 mgKOH/g. Viscosity of each of the resultant thermally conductive compositions is shown in Table 1. Incidentally, methods for measuring viscosity, kinematic viscosity, and acid number are hereinbelow described.

Viscosity

The thermally conductive compositions were left for 30 minutes at room temperature, and then viscosity of each of the compositions was measured using a B-type viscometer. In the measurement was used a No. 6 rotor. The viscosity of each of the compositions was measured when 3 minutes had passed after the rotation started with a rotational frequency of the rotor of 10 min$^{-1}$.

Kinematic Viscosity

Kinematic viscosity was measured in accordance with JIS K2283.

Acid Number

Acid number was measured in accordance with JIS K2501.

TABLE 1

| Composition | Thermally conductive composition (parts by weight) | | | |
| --- | --- | --- | --- | --- |
| | No. 1 | No. 2 | No. 3 | No. 4 |
| 2-ethylhexyl acrylate (binder component) | 100 | 100 | 100 | 100 |
| hexanedioldiacrylate (crosslinking agent) | 0.4 | 0.4 | 0.25 | 0.4 |
| Irganox 1076*[1] (antioxidant) | 0.3 | 0.3 | 0.3 | 0.3 |
| PEROYL-TCP*[2] (thermal polymerization initiator) | 0.05 | 0.05 | 0.10 | 0.05 |
| PERHEXA TMH*[3] (thermal polymerization initiator) | 0.8 | 0.8 | 0.8 | 0.8 |
| tricresyl phosphate (flame retardant) | 50 | 50 | 30 | 50 |
| liquid polyolefin (ethylene-propylene copolymer) | — | 2 | 4 | 2 |
| modified liquid polyolefin (maleinated ethylene-propylene copolymer) | 2 | 4 | 6 | — |
| Titacoat S-151*[4] (titanate-based coupling agent) | — | — | 1 | 3 |
| silicon carbide (average particle diameter: 70 μm) | 40 | 40 | 35 | 40 |
| aluminum hydroxide (average particle diameter: 4 μm) | 560 | 560 | 450 | 560 |
| viscosity (mPa·s) | 18900 | 12600 | 6800 | 30600 |

*[1]Commercial name (produced by Ciba Specialty Chemicals K.K.)
*[2,3]Commercial name (produced by NOF Corp.)
*[4]Commercial name (produced by Nippon Soda Co., Ltd.)

Example 1

The thermally conductive composition No. 1 was held by two PET liners treated with a silicone mold lubricant, and the composition was subjected to calendering to give a sheet having a thickness of 1 mm (excluding the thickness of the PET liners) after the sheet is cured. The obtained molded sheet was heated at 140° C. for 15 minutes in an oven to obtain a thermally conductive sheet having a thickness of 1 mm (Example 1).

Examples 2, 3, Comparative Example 1

Thermally conductive sheets each having a thickness of 1 mm were obtained in the same manner as in Example 1 except that the thermally conductive compositions No. 2 to 4 were used.

With regard to each of the thermally conductive sheets obtained in Examples 1 to 3 and Comparative Example 1, measurement for hardness (Asker C), quantitative analysis of outgas, and evaluation on bleeding were performed. The results are shown in Table 2. Incidentally, the methods for measurement of hardness (Asker C), quantitative analysis of outgas, and evaluation on bleeding are shown below.

Hardness (Asker C)

A sample for the hardness test was prepared by laminating thermally conductive sheets to be tested so that the sample may have a thickness of 10 mm or a minimum thickness above 10 mm. The value obtained by measuring the sample for hardness under a load of 1 kg with an Asker C hardness meter was defined as "hardness (Asker C) (1)." The sample was further kept in an oven at 130° C. After 2 weeks and after 4 weeks, the sample was measured for hardness, and the values obtained were defined as "hardness (Asker C) (2)" and "hardness (Asker C) (3)," respectively.

Outgas

A thermally conductive sheet to be tested was cut to have a size of 0.5×1.0 mm. After the PET liners were peeled off, the sheet was put in a 20 ml vial, which was then sealed. The vial was heated at 110° C. for 1 hour, and then 1 ml of internal gas analyzed by a head space gas chromatography/mass spectrometry (HS-GC/MS). Then, 1 μl of acetone solution containing decane having a known concentration was added to the vial, and analysis by HS-GC/MS was performed in the same manner to give a calibration curve. On the basis of the calibration curve, the total amount (μg·cm$^{-3}$) of the outgas was calculated from each peak area of each sample in HS-GC/MS. In addition, the ratio of phenol type components (phenol, cresol, xylenol, etc.) was calculated as "phenols (% by weight)".

Bleeding

A thermally conductive sheet to be tested was kept in an oven at 130° C. After 1 week, the sample was measured for bleeding on the surface. The standard of the evaluation is shown below.

Good: The color of the surface stayed the same or hardly changed.

Bad: The color of the surface turned yellow.

TABLE 2

| | Thermally conductive composition | Hardness (Asker C) (1) | (2) | (3) | Bleed-ing | Outgas Total amount (μg·cm$^{-3}$) | Phenols (% by weight) |
|---|---|---|---|---|---|---|---|
| Example 1 | No. 1 | 46 | 48 | 62 | good | 33.6 | 3.0 |
| Example 2 | No. 2 | 43 | 46 | 58 | good | 31.4 | 0.5 |
| Example 3 | No. 3 | 38 | 39 | 49 | good | 30.6 | ≦0.1 |
| Comp. Ex. 1 | No. 4 | 46 | 54 | 79 | bad | 44.8 | 27.5 |

It was found that each of the thermally conductive compositions of Nos. 1 to 3 has low viscosity as compared to the thermally conductive composition of No. 4 as shown in Table 1 and is superior in handleability. In addition, from the results of measurement for hardness (Asker C) shown in Table 2, each of the thermally conductive sheets of Examples. 1 to 3 has flexibility equal to or higher than that of the thermally conductive sheet of Comparative Example 1. Further, it was found that, in each of the thermally conductive sheets of Examples. 1 to 3, the flexibility tends to be maintained longer than that in the thermally conductive sheet of

Comparative Example 1

Moreover, it was found that each of the thermally conductive sheets of Examples. 1 to 3 hardly shows bleeding in comparison with the thermally conductive sheet of Comparative Example 1. Furthermore, it was found that, even in the case of using tricresyl phosphate (phosphate ester) as a flame retardant, each of the thermally conductive sheets of Examples. 1 to 3 was very effectively inhibited from generating components such as phenols which cause emission of an offensive odor as compared to the thermally conductive sheet of Comparative Example 1.

A thermally conductive sheet of the present invention has good moldability, and the surface of the sheet is inhibited from being contaminated by bleeding or the like, and the sheet has good flexibility which can be maintained for a long period of time. Further, the sheet is inhibited from emitting an offensive odor even when a phosphate ester is contained as a flame retardant. Therefore, a thermally conductive sheet of the present invention is suitable as a thermally conductive sheet disposed between a radiating body such as a heat sink and a heat-generating part for electronics or electronic parts including an integrated circuit (IC).

What is claimed is:

1. A thermally conductive sheet comprising:
   a binder component;
   a modified liquid polyolefin that is a liquid at a temperature of 25° C. and is derived from a homopolymer or copolymer selected from ethylene, propylene, butene-1, hexene-1, octene-1, decene-1,4-methylpentene-1, and 2-methylpropene together with maleic anhydride or a maleic anhydride derivative; and
   at least one thermally conductive filler selected from the group consisting of metal oxide and metal hydroxide.

2. A thermally conductive sheet according to claim 1, wherein said metal oxide is alumina and said metal hydroxide is aluminum hydroxide or magnesium hydroxide.

3. A thermally conductive sheet according to claim 1, wherein said modified liquid polyolefin is prepared by modifying a predetermined polyolefin having a kinematic viscosity of 100 to 2500 mm$^2$/s at 40° C.

4. A thermally conductive sheet according to claim 1, wherein said modified liquid polyolefin has an acid number of 5 to 130 mgKOH/g.

5. A thermally conductive sheet according to claim 1, which further comprises an organic phosphorus compound as a flame retardant.

6. A thermally conductive sheet according to claim 1, wherein said binder component is prepared by polymerizing (meth)acrylic monomers.

* * * * *